(12) United States Patent
Jung et al.

(10) Patent No.: US 7,569,483 B2
(45) Date of Patent: Aug. 4, 2009

(54) METHODS OF FORMING METAL SILICIDE LAYERS BY ANNEALING METAL LAYERS USING INERT HEAT TRANSFERRING GASES ESTABLISHED IN A CONVECTION APPARATUS

(75) Inventors: Sug-Woo Jung, Gyeonggi-do (KR); Gil-Heyun Choi, Gyeonggi-do (KR); Jong-Ho Yun, Gyeonggi-do (KR); Kwan-Jong Roh, Gyeonggi-do (KR); Eun-Ji Jung, Gyeonggi-do (KR); Hyun-Su Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 314 days.

(21) Appl. No.: 11/199,439

(22) Filed: Aug. 8, 2005

(65) Prior Publication Data

US 2006/0063380 A1 Mar. 23, 2006

(30) Foreign Application Priority Data

Aug. 9, 2004 (KR) ...................... 10-2004-0062632

(51) Int. Cl.
*H01L 21/44* (2006.01)
(52) U.S. Cl. ...................... 438/664; 438/682; 438/592; 257/E21.199; 257/E21.165
(58) Field of Classification Search ................. 438/664; 257/E21.199
See application file for complete search history.

(56) References Cited

U.S. PATENT DOCUMENTS

| | | | |
|---|---|---|---|
| 5,449,642 A | 9/1995 | Tan et al. | |
| 5,989,988 A | 11/1999 | Iinuma et al. | |
| 6,194,755 B1 | 2/2001 | Gambino et al. | |
| 6,518,107 B2 | 2/2003 | Buynoski et al. | |
| 6,544,872 B1 | 4/2003 | Buynoski et al. | |
| 6,884,669 B2 | 4/2005 | Chang et al. | |
| 7,307,017 B2 * | 12/2007 | Lee et al. | 438/649 |
| 2003/0029715 A1 * | 2/2003 | Yu et al. | 204/192.2 |

(Continued)

FOREIGN PATENT DOCUMENTS

CN 1257309 6/2000

(Continued)

OTHER PUBLICATIONS

Chinese Office Action, Chinese Patent Application No. 200510091182.9, Feb. 1, 2008.

(Continued)

*Primary Examiner*—Marcos D. Pizarro
*Assistant Examiner*—Igwe U. Anya
(74) *Attorney, Agent, or Firm*—Myers Bigel Sibley & Sajovec

(57) ABSTRACT

Methods of forming metal silicide layers include a convection-based annealing step to convert a metal layer into a metal silicide layer. These methods may include forming a silicon layer on a substrate and forming a metal layer (e.g., nickel layer) in direct contact with the silicon layer. A step is then performed to convert at least a portion of the metal layer into a metal silicide layer. This conversion step is includes exposing the metal layer to an inert heat transferring gas (e.g., argon, nitrogen) in a convection or conduction apparatus.

12 Claims, 8 Drawing Sheets

U.S. PATENT DOCUMENTS

| | | | | |
|---|---|---|---|---|
| 2004/0061184 A1* | 4/2004 | Lu et al. | | 257/384 |
| 2004/0142517 A1 | 7/2004 | Chang et al. | | |
| 2004/0259342 A1 | 12/2004 | Chang et al. | | |
| 2004/0266194 A1* | 12/2004 | Iinuma | | 438/694 |
| 2005/0095873 A1* | 5/2005 | Granneman et al. | | 438/795 |
| 2005/0202664 A1* | 9/2005 | Jawarani | | 438/592 |
| 2005/0266664 A1* | 12/2005 | Harrison et al. | | 438/592 |
| 2005/0272215 A1* | 12/2005 | Lee | | 438/369 |
| 2006/0073656 A1* | 4/2006 | Jain et al. | | 438/233 |
| 2006/0267117 A1* | 11/2006 | Jaiswal | | 257/412 |

FOREIGN PATENT DOCUMENTS

| | | |
|---|---|---|
| CN | 1517300 | 8/2004 |
| EP | 0967643 A2 | 12/1999 |
| JP | 2004-063574 | 2/2004 |
| JP | 2004-140262 | 5/2004 |
| KR | 10-2003-0039387 A | 5/2003 |

OTHER PUBLICATIONS

Taiwanese Office Action, Taiwan Patent Application No. 091427053, Feb. 18, 2008.

* cited by examiner

METHODS OF FORMING METAL SILICIDE LAYERS BY ANNEALING METAL LAYERS USING INERT HEAT TRANSFERRING GASES ESTABLISHED IN A CONVECTION APPARATUS

REFERENCE TO PRIORITY APPLICATION

This application claims the benefit of Korean Patent Application No. 2004-62632, filed Aug. 9, 2004, the contents of which are hereby incorporated herein by reference in their entirety.

FIELD OF THE INVENTION

The present invention relates to a method of fabricating a semiconductor device and, more particularly, to a salicide process and method of fabricating a semiconductor device using the same.

BACKGROUND OF THE INVENTION

Discrete devices such as MOS transistors are widely used as switching devices in integrated circuits. As integrated circuits become more and more integrated, MOS transistors are increasingly scaled down. As a result, the channel length of each MOS transistor is reduced and this reduction may cause short-channel effects. To inhibit short-channel effects, the junction depth of source and drain regions of the MOS transistor as well as the thickness of the gate insulating layer are typically reduced. However, the reduction of the junction depth and the gate insulator thickness increases resistance (R) and capacitance (C) of the gate electrode. In this case, an electrical signal, which is applied to the gate electrode, is transferred more slowly due to a resistance-capacitance (RC) delay time. In addition, the sheet resistance of the source and drain regions increases because of their shallow junction depths, lowering drivability of the short channel MOS transistor.

To address these problems, a self-aligned silicide (salicide) process is widely used to implement a high performance MOS transistor suitable for the highly integrated semiconductor device. The salicide process is a process technology for reducing electrical resistance of the gate electrode and the source and drain regions by selectively forming a metal silicide layer on the gate electrode and the source and drain regions. A cobalt silicide layer, a titanium silicide layer, or the like is being widely adopted as the metal silicide layer. In particular, the resistance of the cobalt silicide layer has much less dependency on a change in line width. Accordingly, a technology for forming a cobalt silicide layer on the gate electrode of the short channel MOS transistor is being widely used.

One example of a cobalt-disilicide process is disclosed in U.S. Pat. No. 5,449,642 to Tan et al. Another method of forming a cobalt silicide layer is disclosed in U.S. Pat. No. 5,989,988, to Linuma et al. However, when the gate electrode has a width of less than about 0.1 µm, the cobalt silicide layer has a limitation in its application due to a phenomenon known as agglomeration. To address this limitation, nickel salicide processes are being used to manufacture high-performance MOS transistors. A nickel silicide layer may be formed at a relatively low temperature, but may also have poor thermal stability.

The salicide process includes a silicidation annealing process. Typically, a rapid thermal process (RTP) is employed as the annealing process. The RTP performs annealing at a high temperature in a short period of time to solve problems such as the diffusion of unwanted impurities. However, in the RTP, a substrate is heated by radiation from a light source lamp such as a tungsten halogen lamp, and a small change in the radiation affects temperature distribution in the substrate. Further, a desired annealing temperature may not be carefully maintained. Temperature fluctuations may occur more severely as the annealing temperature becomes lower.

Accordingly, it may be improper to use the RTP with the radiation scheme in order to form the silicide layer such as the nickel silicide layer, which is formed at the last process, of which the quality is sensitive to the annealing temperature. That is, application of the RTP to formation of the nickel silicide layer, which entails rapid lamp rate and undesirable annealing temperature fluctuation, may cause defects on the layer surface and in turn it may deteriorate the electrical characteristics of the semiconductor device having the nickel silicide layer.

SUMMARY OF THE INVENTION

Methods of forming metal silicide layer according to embodiments of the invention include forming a silicon layer on a substrate and forming a metal layer in contact with the silicon layer. At least a portion of the metal layer is converted into a metal silicide layer. This conversion step is performed by exposing the metal layer to a heat transferring gas in a convection or conduction apparatus. The heat transferring gas is a chemically inert gas, such as one selected from the group consisting of argon and nitrogen.

In some of these embodiments of the invention, the converting step includes exposing the metal layer to the heat transferring gas for a sufficient duration to convert at least a portion of the metal layer into a metal silicide layer. In these embodiments, the heat transferring gas is continuously maintained within five degrees Celsius of a preselected temperature during the converting step. The preselected temperature is in a range from between about 300° C. to about 600° C. In further aspects of these embodiments, the converting step may be preceded by the step of forming an electrically insulating capping layer on the metal layer and the step of removing unreacted nickel may include removing unreacted nickel and the capping layer from the metal layer.

Additional embodiments of the invention include forming an insulated gate electrode on a surface of a semiconductor substrate and forming source and drain regions of first conductivity type that extend in the semiconductor substrate and adjacent the insulated gate electrode. A metal layer is also formed. This metal layer is formed in contact with the source and drain regions. At least a portion of the metal layer is converted into a metal silicide layer by exposing the metal layer to a heat transferring gas in a convection or conduction apparatus.

Still further embodiments of the invention include methods of forming a field effect transistor by forming an insulated gate electrode on a surface of a semiconductor substrate. This insulated gate electrode includes a silicon gate electrode on a gate insulating layer. Source and drain regions of first conductivity type are also formed. These regions extend in the semiconductor substrate and adjacent the insulated gate electrode. The electrically insulating layer is formed on the insulated gate electrode and on the source and drain regions. The electrically insulating layer is etched back to expose an upper surface of the silicon gate electrode. A metal layer is then formed in contact with the upper surface of the silicon gate electrode. At least a portion of the metal layer is then converted into a metal silicide layer. This conversion step occurs by exposing the metal layer to a heat transferring gas in a convection or conduction apparatus.

DETAILED DESCRIPTION OF THE INVENTION

Figure 1:
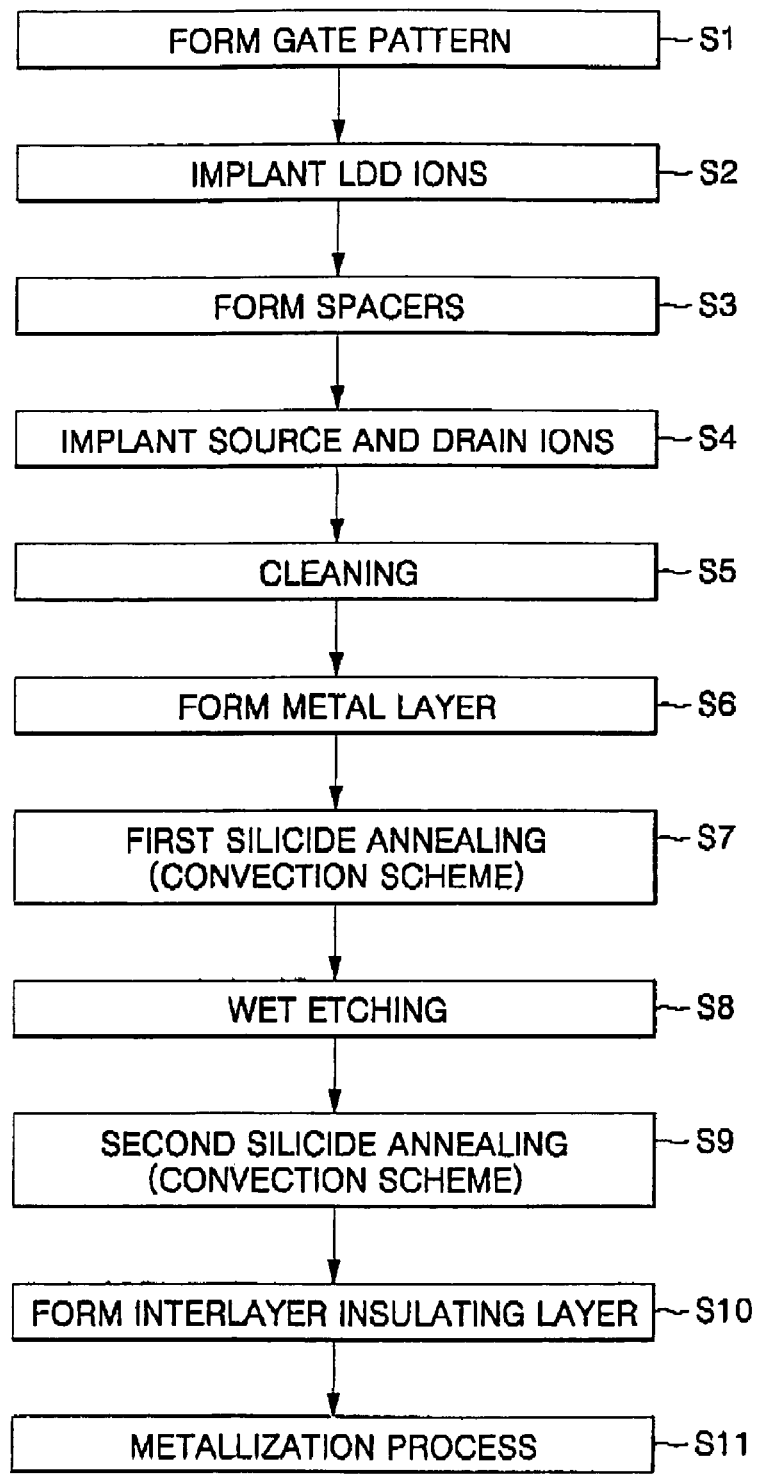
FIG. 1 is a flow diagram that illustrates methods of forming metal silicide layers according to embodiments of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and fully convey the scope of the invention to those skilled in the art. In the drawings, the thickness of layers and regions are exaggerated for clarity. Like numbers refers to like elements throughout the specification.

FIG. 1 is a process sequence diagram illustrating a salicide process and method of fabricating a semiconductor device using the same according to an embodiment of the present invention. Further, FIGS. 2 to 6 are cross-sectional views illustrating a salicide process and method of fabricating a semiconductor device using the same according to an embodiment of the present invention.

Figure 2:
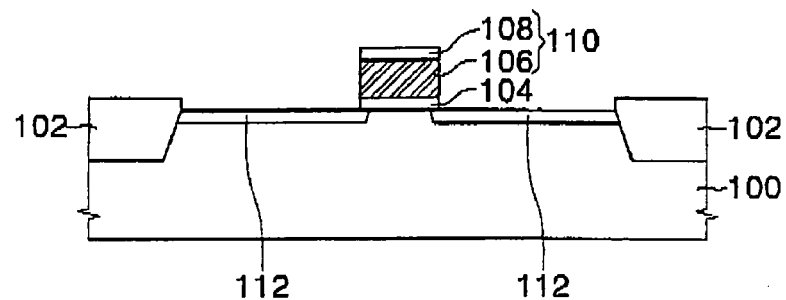
FIGS. 2-6 are cross-sectional views of intermediate structures that illustrate methods of forming field effect transistors with metal silicide source/drain contacts according to embodiments of the invention.

Referring to FIGS. 1 and 2, an isolation layer 102 is formed in a predetermined region of a semiconductor substrate 100 to define an active region. The semiconductor substrate 100 may be a silicon substrate or a silicon on insulator (SOI) substrate. A gate insulating layer is formed on the active region. A gate conductive layer and a gate capping layer are sequentially formed on the entire surface of the semiconductor substrate having the gate insulating layer. The gate conductive layer may be formed of a silicon layer such as a polysilicon layer. The silicon layer may be doped with N-type impurities or P-type impurities. Alternatively, the gate conductive layer may be formed by sequentially stacking a silicon layer and a tungsten silicide layer. Further, the gate capping layer is formed of an insulating layer, such as a silicon oxide layer or a silicon nitride layer. The process of forming the gate capping layer may be omitted.

The gate capping layer and the gate conductive layer are then patterned to form a gate pattern 110 that crosses over the active region (S1 in FIG. 1). The resultant gate pattern 110 includes a gate electrode 106 and a gate capping layer pattern 108, which are sequentially stacked. The gate electrode 106 is composed of only a silicon layer pattern when the gate conductive layer is formed of only the silicon layer. Alternatively, the gate electrode 106 includes a silicon layer pattern and a tungsten silicide layer pattern, which are sequentially stacked, when the gate conductive layer is formed by sequentially stacking the silicon layer and the tungsten silicide layer. However, when the formation of the gate capping layer is omitted, the gate pattern 110 is composed of only the gate electrode 106. Meanwhile, the gate insulating layer may be also patterned when the gate pattern 110 is formed. As a result, a gate insulating layer pattern 104 is formed between the gate pattern 110 and the active region, as shown in FIG. 2. Subsequently, first impurity ions are implanted into the active region using the gate pattern 110 and the isolation layer 102 as ion implantation masks to form lightly doped drain (LDD) regions 112 (S2 in FIG. 1). The first impurity ions may be N-type impurity ions or P-type impurity ions.

Figure 3:
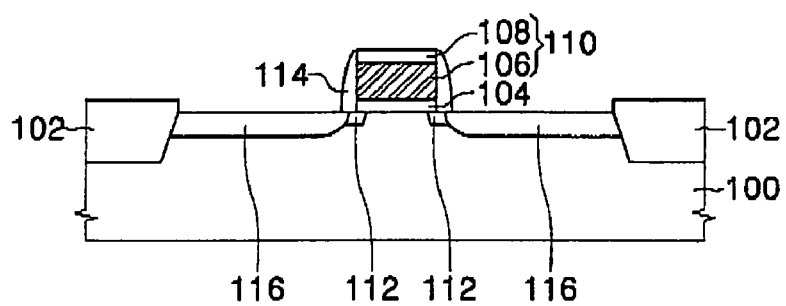

Referring to FIGS. 1 and 3, a spacer insulating layer is formed on the entire surface of the semiconductor substrate having the LDD regions 112. The spacer insulating layer may be formed of a silicon nitride layer. The spacer insulating layer is anisotropically etched to form spacers 114 on sidewalls of the gate pattern 110 (S3 in FIG. 1). Second impurity ions are implanted into the active region using the gate pattern 110, the spacers 114 and the isolation layer 102 as ion implantation masks to form source/drain regions 116 (S4 in FIG. 1). As a result, the LDD regions 112 remain under the spacers 114. The second impurity ions may be N-type impurity ions or P-type impurity ions and have the same conductivity as that of the impurity ions that are implanted into the active region upon the LDD ion implantation. The semiconductor substrate having the source/drain regions 116 is annealed to activate the impurity ions within the source/drain regions 116. The gate pattern 110, the gate insulating layer 104, the source/drain regions 116 and the spacers 114 constitute a MOS transistor.

Figure 4:
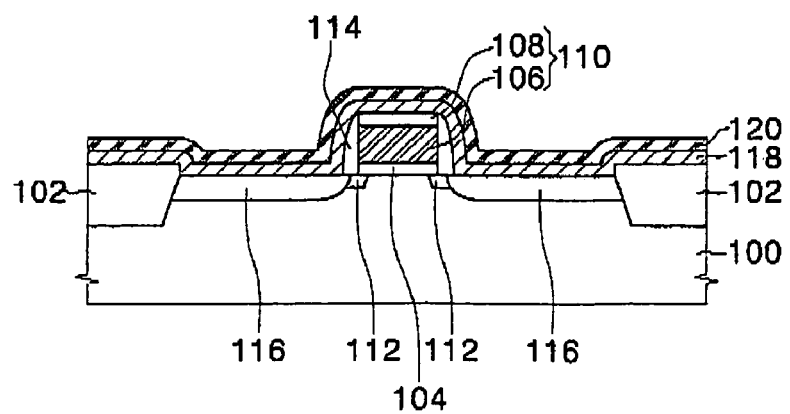

Referring to FIGS. 1 and 4, after the source/drain annealing process is completed, the surface of the semiconductor substrate is cleaned to eliminate a native oxide layer and contaminated particles remaining on the source/drain regions 116 (S5 in FIG. 1). A metal layer 118 is formed on the entire surface of the cleaned semiconductor substrate (S6 in FIG. 1). In the embodiments of the present invention, the metal layer 118 is formed of a nickel layer. After the nickel layer 118 is formed, a capping layer 120 is formed on the nickel layer 118. The capping layer 120 may be formed of a titanium nitride (TiN) layer. The capping layer 120 is formed to prevent the nickel layer 118 from being oxidized during subsequent silicidation annealing. However, the process of forming the capping layer 120 may be omitted.

Figure 5:
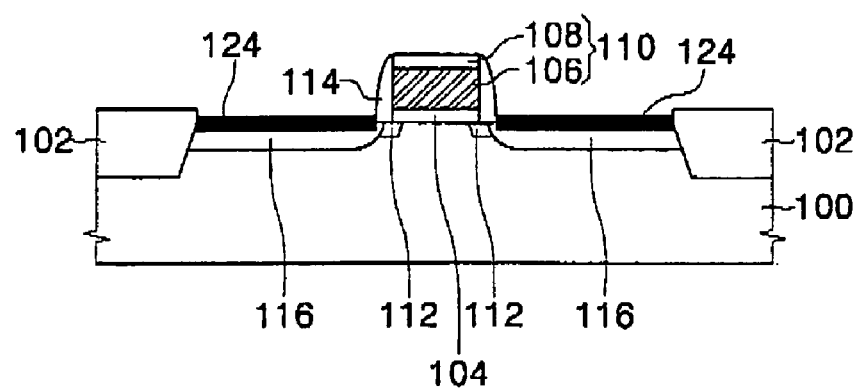

Referring to FIGS. 1 and 5, a silicidation annealing process is performed on the semiconductor substrate having the nickel layer 118 and the capping layer 120. Specifically, the silicidation annealing process includes annealing the semiconductor substrate having the nickel layer 118 and the capping layer 120. The silicidation annealing process may include a first silicidation annealing process (S7 in FIG. 1) and a second silicidation annealing process (S9 in FIG. 1). The first silicidation annealing process (S7 in FIG. 1) may be performed at a temperature of 200 to 400° C. and preferably 300 to 400° C. In this case, the nickel layer 118 on the source/drain regions 116 reacts with silicon atoms within the source/drain regions 116 to form di-nickel mono-silicide ($Ni_2Si$) or nickel mono-silicide (NiSi). Subsequently, an unreacted nickel layer 118 on the spacers 114, the isolation layer 102 and the gate capping layer pattern 108 is removed (S8 in FIG. 1). The unreacted nickel layer 118 may be removed, for example, using a mixture of sulfuric acid ($H_2SO_4$) and hydrogen peroxide ($H_2O_2$). While the unreacted nickel layer 118 is removed, the capping layer 120 may also be stripped.

Subsequently, after the unreacted nickel layer 118 is removed, the second silicidation annealing process is performed on the semiconductor substrate (S9 in FIG. 1). The second silicidation annealing process may be performed at a temperature of 300 to 600° C. and preferably 400 to 500° C. In this case, the di-nickel mono-silicide ($Ni_2Si$) formed during the first silicidation annealing process is phase-changed into nickel mono-silicide (NiSi) having a small resistivity, resulting in nickel silicide (NiSi) layers 124 containing nickel mono-silicide (NiSi) having a small resistivity.

Meanwhile, the second silicidation annealing process (S9 of FIG. 1) may be omitted. In this case, the first silicidation annealing process (S7 of FIG. 1) may be performed at a temperature of 300 to 600° C. in order to form the nickel silicide layers 124.

When the gate pattern 110 includes a gate electrode 106 and a gate capping layer pattern 108 as described above, the nickel silicide layers 124 are selectively formed only on the source/drain regions 116 as shown in FIG. 5.

Meanwhile, when the gate pattern 110 consists of only the gate electrode 106 and the gate electrode 106 consists of only a silicon layer pattern, another nickel silicide layer (not shown) having the same material structure as that of the nickel silicide layers 124 is formed on the gate electrode 106 consisting of the silicon layer pattern during the silicidation annealing process.

It is generally known that, when the nickel silicide layer is formed of a nickel layer, defects are created on the surface of the nickel silicide layer due to its poor thermal stability, such that the nickel silicide layer has rough surface morphology. Upon application of the nickel silicide layer to a semiconductor device such as an actual MOS transistor, the rough surface morphology results in poor interface properties between the silicon substrate and the silicide layer. As a result, the surface defects increase the sheet resistance and contact resistance of the nickel silicide layer as well as deteriorate electrical characteristics of the MOS transistor such as junction leakage at a junction interface. The surface defects of the nickel silicide layer are sensitive to the silicidation annealing temperature, annealing time, annealing atmosphere, and lamp rate. Further, the surface defects are also affected by impurity ions. In particular, a number of surface defects are created when the nickel silicide layer is formed on the silicon substrate doped with the N-type impurity ions.

In embodiments of the present invention, the silicidation annealing process (S7 and S9 in FIG. 1) includes isothermally heating the semiconductor substrate through convection of a heat transferring gas. The conventional RTP used in the silicidation annealing process is a radiation scheme using a light source such as a lamp or a conduction scheme using a hot plate while the silicidation annealing process according to embodiments of the present invention (S7 and S9 in FIG. 1) utilizes a convection scheme using a heat transferring gas, thus allowing more stable annealing.

Figure 9:
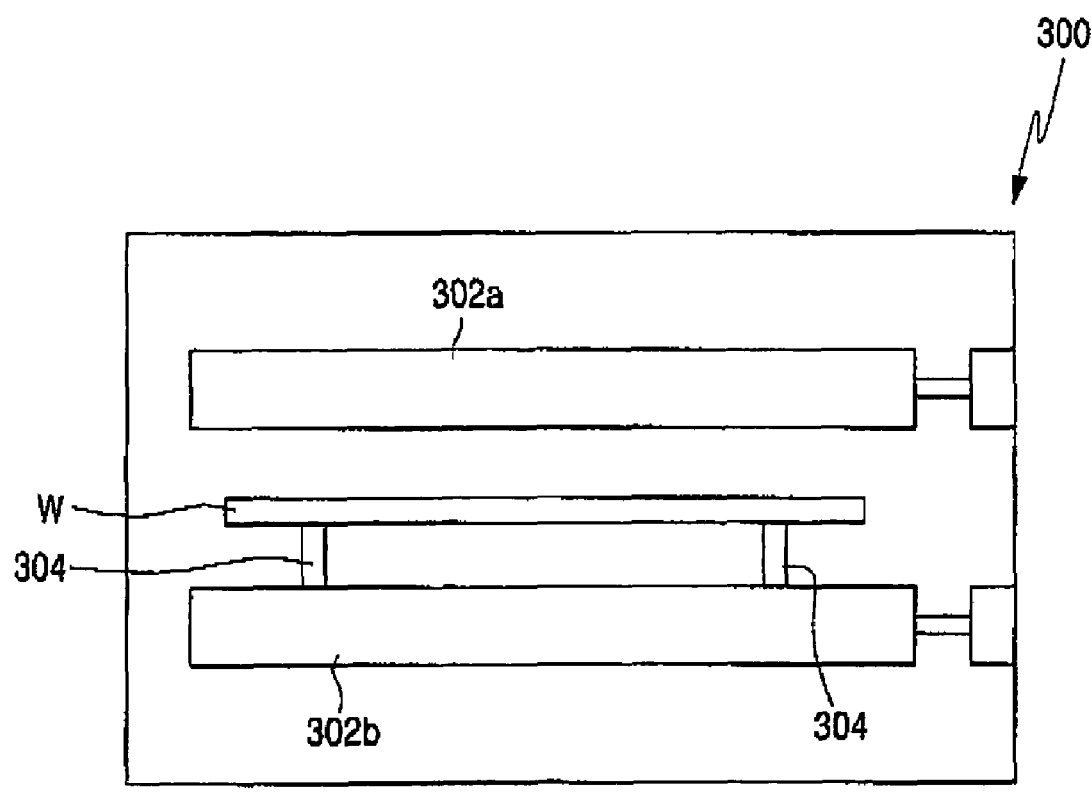
FIG. 9 is a schematic view of an annealing chamber that supports the convection-based annealing of metal layers described herein.

FIG. 9 is a schematic cross-sectional view illustrating an annealing chamber for use in a silicidation annealing process according to embodiments of the present invention. The silicidation annealing process will be hereinafter described in more detail according to the embodiments of the present invention. Meanwhile, an annealing chamber described below is disclosed in U.S. Pat. No. 6,345,150, which is incorporated herein by reference in their entirety.

Referring to FIG. 9, a semiconductor substrate (W) is loaded into an annealing chamber 300. Pumping and purging processes may be performed to clean inside the annealing chamber 300 before loading the semiconductor substrate (W). An inert gas such as nitrogen or argon may be used for the purging process. After the semiconductor substrate (W) is loaded, the annealing chamber 300 is kept in an inert gas atmosphere under atmospheric pressure. The inert gas serves as a gas for suppressing an undesirable reaction such as an oxidation reaction during the subsequent silicidation annealing process and as a heat transferring gas for heating the semiconductor substrate (W). The MOS transistor and the nickel layer (118 in FIG. 4) are formed on the semiconductor substrate (W), as illustrated in FIGS. 2 to 4.

The annealing chamber 300 includes an upper hot plate 302a and a lower hot plate 302b therein as heat sources for heating the semiconductor substrate (W). The semiconductor substrate (W) is positioned to be spaced apart from the hot plates 302a and 302b therebetween. The upper hot plate 302a may be optionally provided. The semiconductor substrate (W) is spaced apart from the lower hot plate 302b by a plurality of supports 304 disposed on the lower hot plate 302b. The supports 304 may be made of quartz. In this case, it is desirable that the semiconductor substrate (W) is spaced apart from the upper and lower hot plates 302a and 302b at the same distances. For example, when an interval between the upper hot plate 302a and the lower hot plate 302b is 20 mm and the thickness of the semiconductor substrate (W) is about 4 mm, each support 304 may have a height of 8 mm. The semiconductor substrate (W) is then annealed at a silicidation temperature for a predetermined period of time. Specifically, in the embodiments of the present invention, the silicidation annealing temperature may be the temperature of the hot plates 302a and 302b.

According to the embodiments of the present invention, since the semiconductor substrate (W) is heated by the inert gases used as heat transferring gases, it does not experience rapid temperature fluctuation. In the embodiments of the present invention, it is desirable that a time to reach the silicidation annealing temperature is more than one minute. This ramp-up rate may vary depending on the interval between the hot plates 302a and 302b and the semiconductor substrate (W) or on the inert gases provided as heat transferring gases. Further, according to the embodiments of the present inventions, it is possible to uniformly heat the semiconductor substrate (W) without local temperature deviations even when structures such as a MOS transistor are formed on the semiconductor substrate (W), by adopting the convection scheme rather than the radiation or the conduction as a key heat transferring mechanism unlike the prior arts. Moreover, the temperature inside the annealing chamber 300, more specifically, the temperature at the semiconductor substrate (W) and ambient temperature thereof may be kept stably without temperature fluctuation at the silicidation temperature. Preferably, the temperature fluctuation is less than ±5° C.

As a result, the nickel silicide layers 124 formed by annealing using the convection scheme may have defect-free surface morphology, unlike that formed by the conventional RTP scheme of the radiation scheme or the conventional annealing scheme of the conduction scheme by hot plates (direct heating).

Figure 6:
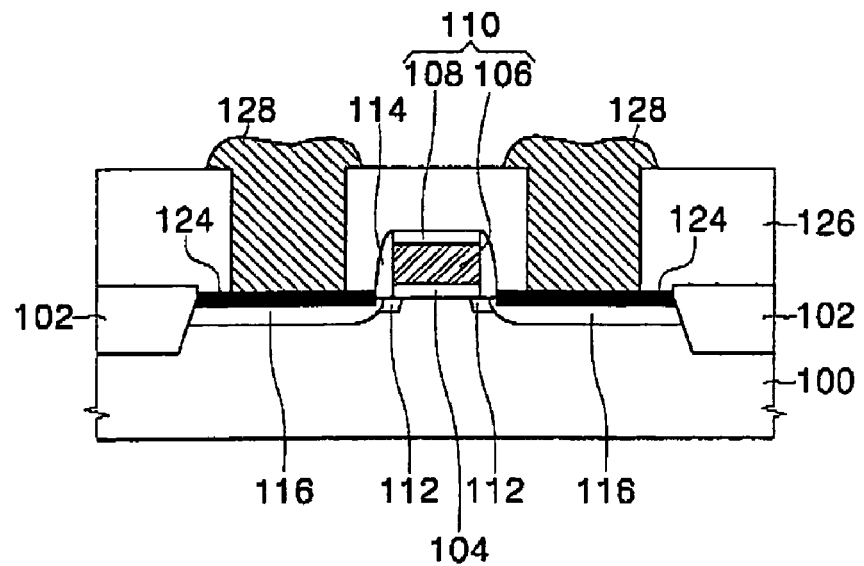

Referring to FIGS. 1 and 6, an interlayer insulating layer 126 is formed on the entire surface of the semiconductor substrate having the nickel silicide layers 124 (S10 in FIG. 1).

The interlayer insulating layer 126 is patterned to form contact holes that expose the nickel silicide layers 124 on the source/drain regions 116. A metal layer is formed on the entire surface of the semiconductor substrate having the contact holes and then patterned to form metal interconnections 128 that fill the contact holes (S11 in FIG. 1).

Figure 7:
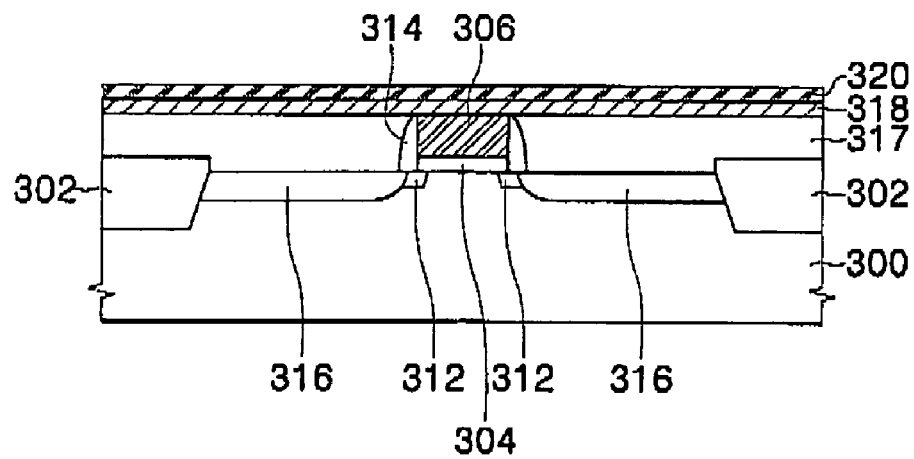
FIGS. 7-8 are cross-sectional views of intermediate structures that illustrate methods of forming field effect transistors with metal silicide gate electrodes according to embodiments of the invention.
Figure 8:
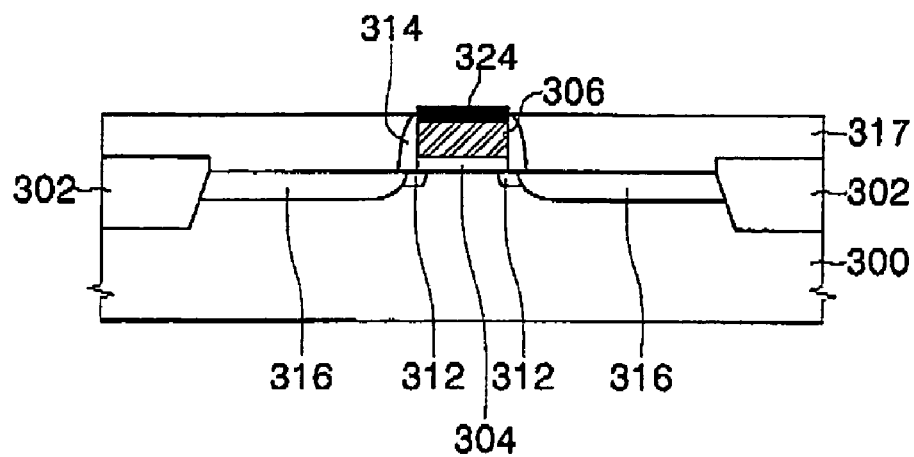

FIGS. 7 and 8 are cross-sectional views illustrating a method of fabricating a semiconductor device according to another embodiment of the present invention.

Referring to FIG. 7, a MOS transistor is formed by the same method as that in the embodiment illustrated in FIGS. 2 and 3. That is, an isolation layer 302 is formed within a semiconductor substrate 300 to define an active region, and a gate insulating layer 304 and a gate electrode 306 are formed on the active region. LDD regions 312, spacers 314, and source/drain regions 316 are then formed. In this embodiment, a gate pattern of the MOS transistor is formed to have only a gate electrode 306 consisting of a silicon layer pattern. N-type or P-type impurity ions may be doped into the silicon layer pattern. A mask insulating layer is then formed on the entire surface of the semiconductor substrate having the MOS transistor. Preferably, the mask insulating layer is formed of an insulating layer that has an etch selectivity with respect to the gate electrode 306. For example, the mask insulating layer may be formed of a silicon oxide layer. The mask insulating layer is planarized to form a mask pattern 317 that exposes the gate electrode 306. As a result, at least the source/drain regions 316 are covered with the mask pattern 317. A nickel layer 318 and a capping layer 320 are sequentially formed on the entire surface of the semiconductor substrate having the exposed gate electrode 306. The process of forming the capping layer 320 may be omitted.

Referring to FIG. 8, a silicidation annealing process is then performed on the semiconductor substrate having the nickel layer 318 and the capping layer 320. The silicidation annealing process is performed by the same method as that illustrated in FIG. 5. As a result, a nickel silicide layer 324 is selectively formed only on the gate electrode 306. Although not shown, a metallization process is then applied to the semiconductor substrate having the nickel silicide layer 324. The metallization process is performed by the same method as that illustrated in FIG. 6.

In the foregoing, the nickel salicide process has been discussed. However, the spirit of the present invention is not limited to the process and the present invention is applicable to a salicide process using cobalt, titanium, or refractory metal.

Embodiments of the invention will now be described more fully with comparison to a pair of conventional annealing processes that utilize RTP and hot plate conduction. These processes, which include annealing steps highlighted by TABLE 1, were performed on arsenic-doped semiconductor wafers. In particular, Examples 1 and 2 in TABLE 1 represent conventional processes and Example 3 represents a process performed in accordance with embodiments of the invention.

TABLE 1

| Process conditions | Example 1 (Prior Art) | Example 2 (Prior Art) | Example 3 |
|---|---|---|---|
| Metal layer | Nickel layer 100 Å | | |
| Annealing scheme | RTP | Hot plates (conduction scheme) | Convection scheme |
| First annealing | 430° C./30 sec/ nitrogen atmosphere | 320° C./3 minutes/ vacuum atmosphere | 320° C./3 minutes/ nitrogen atmosphere |
| Second annealing | Skip | 430° C./5 minutes/ nitrogen atmosphere | 430° C./5 minutes/ nitrogen atmosphere |

In Table 1, the conventional RTP process of Example 1 was performed using a rapid annealing apparatus, which uses a tungsten halogen lamp as a heat source. Further, the hot-plate annealing of Example 2 was performed within an annealing chamber for the ENDURA system, which is commercially available from Applied Materials, Inc. of Santa Clara, Calif., United States. Meanwhile, the convection annealing, according to an embodiment of the present invention, was performed using an annealing oven, product model No. SAO-300LP that is available from WaferMasters, Inc. of San Jose, Calif., United States.

Upon completion of the second annealing steps, the surface morphologies of the nickel silicide layer samples of Examples 1-2 were analyzed using a scanning electron microscope (SEM). This analysis resulted in a detection of relatively severe surface roughness.

This surface morphology indicates that the application of the nickel silicide layers to an actual MOS transistor would provide an uneven interface between the silicon substrate and the nickel silicide layer. On the other hand, a nickel silicide layer formed according to Example 3 exhibited relatively defect-free surface morphology. Although not wishing to be bound by any theory, it is believed that this advantageous result is achieved because thermal stress, which was applied to the nickel silicide layer formed during the silicidation annealing, was reduced in response to more stable annealing conditions available when the silicidation annealing was performed using the convection scheme described herein.

Figure 10:
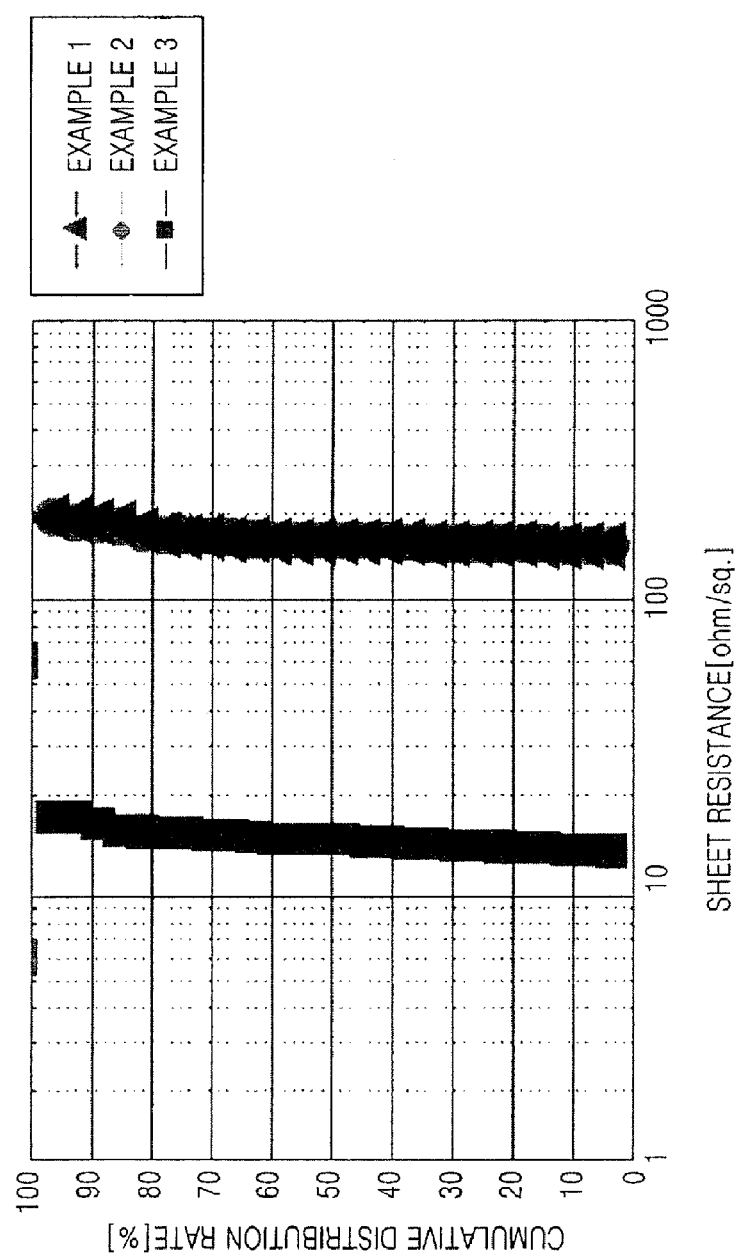
FIG. 10 is a graph of sheet resistance of nickel silicide layers formed on an N-type impurity region and in accordance with an embodiment of the present invention and conventional techniques.

FIG. 10 is a graph showing sheet resistances of nickel silicide layers each formed on an N-type impurity region according to an embodiment of the present invention (Example 3) and the conventional methods of Examples 1-2. In FIG. 10, the abscissa indicates sheet resistance ($R_S$) and the ordinate indicates cumulative distribution rate. Here, the nickel silicide layers were formed on active regions that are doped with N-type impurity ions. The active regions were defined to have a width of 120 nm by an isolation layer, and were doped with arsenic (As) ions. Further, the nickel silicide layers were each formed under the key process conditions listed in Table 1.

Referring to FIG. 10, the nickel silicide layers formed by Examples 1-2 showed sheet resistances of 150 to 200 ohm/sq., while the nickel silicide layer formed by Example 3 showed a much lower sheet resistance of 10 to 20 ohm/sq.

Figure 11:
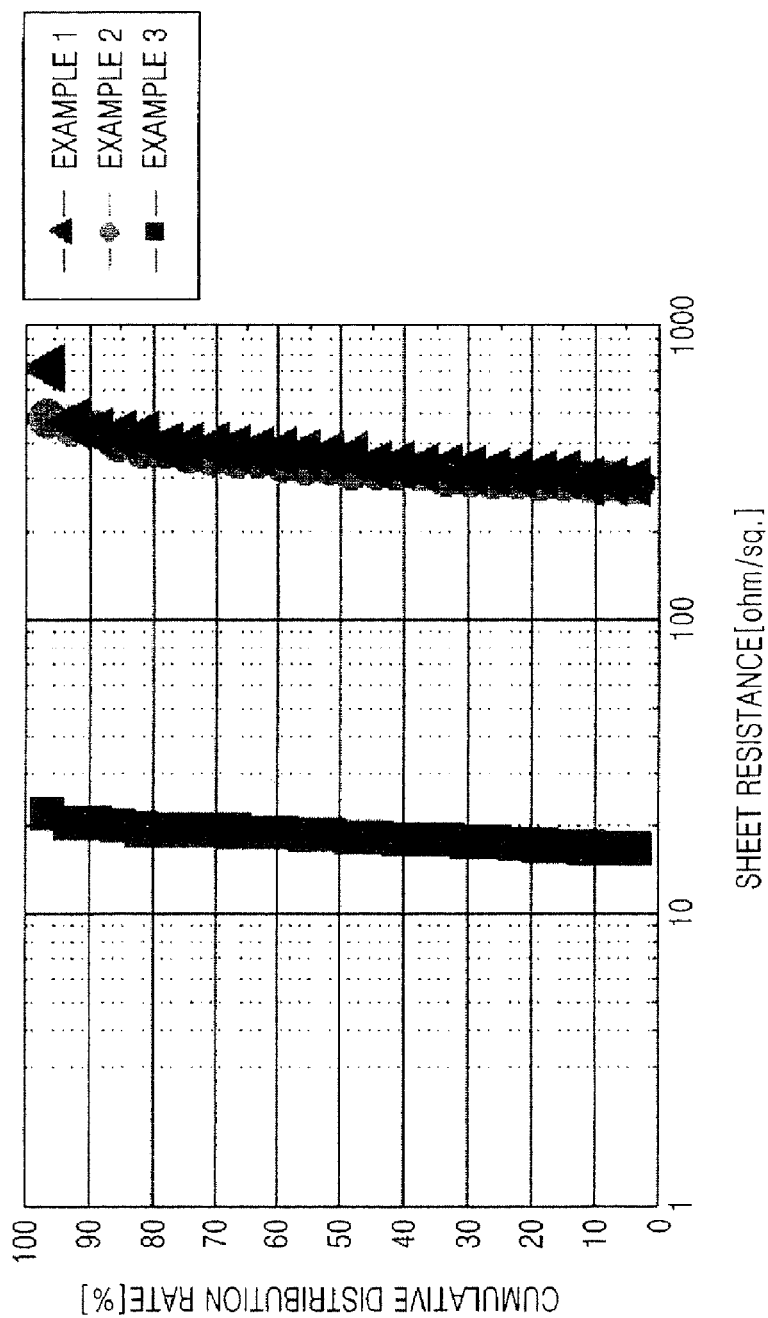
FIG. 11 is a graph of sheet resistance of nickel silicide layers formed on an N-type polysilicon layer and in accordance with an embodiment of the present invention and conventional techniques.

FIG. 11 is a graph showing sheet resistances of the nickel silicide layers each formed on the N-type polysilicon pattern according to Examples 1-3. In FIG. 11, the abscissa indicates sheet resistance ($R_S$) and the ordinate indicates cumulative distribution rate. Here, the nickel silicide layers were formed on line-shaped polysilicon patterns having a thickness of 120 nm and a width of 90 nm, and the polysilicon patterns were doped with arsenic (As) ions in advance. The nickel silicide layers showing the results of FIG. 10 were also formed under the key process conditions listed in Table 1. Referring to FIG. 11, it is shown that the nickel silicide layers formed by Examples 1-2 showed high and nonuniform sheet resistances greater than about 300 ohm/sq., while the nickel silicide layer formed by Example 3 showed a low sheet resistance in a range of 15 to 25 ohm/sq.

Figure 12:
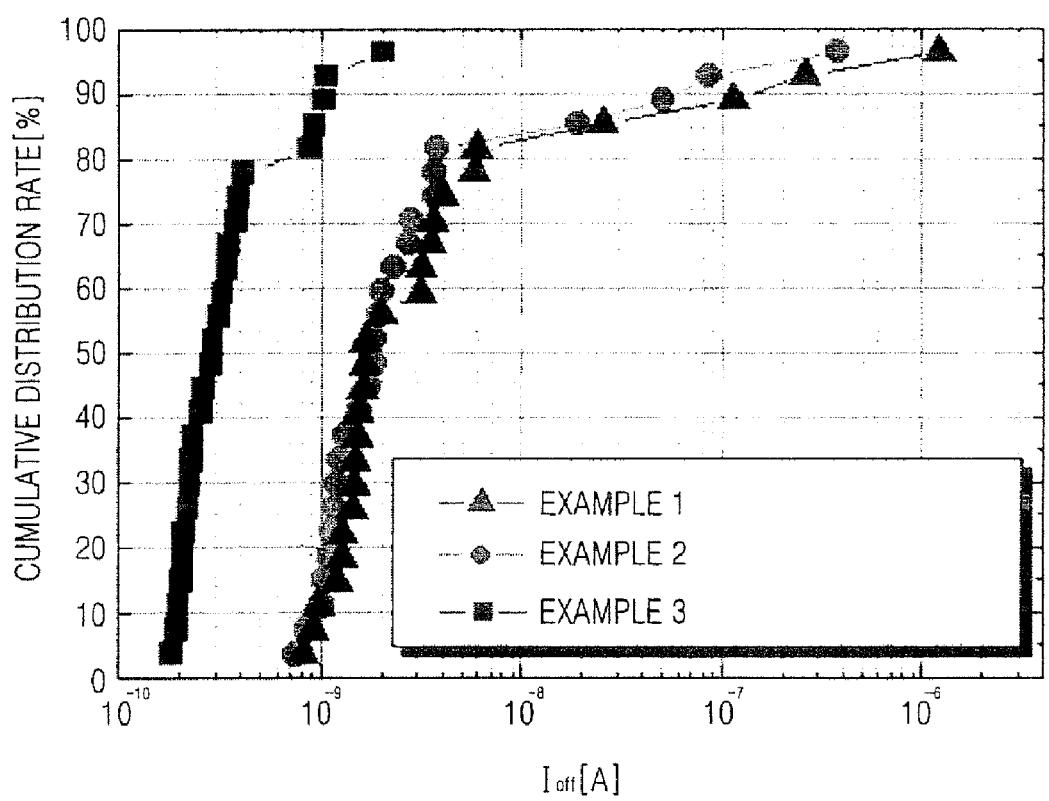
FIG. 12 is a graph showing the off-current characteristics of NMOS transistors formed in accordance with an embodiment of the present invention and conventional techniques.

FIG. 12 is a graph showing drain off-current characteristics of NMOS transistors according to an embodiment of the present invention and prior arts. In FIG. 12, the abscissa indicates drain off-current ($I_{off}$) and the ordinate indicates cumulative distribution rate. Here, the NMOS transistors were fabricated under the key process conditions listed in Table 2. In Table 2, the silicidation annealing was performed under the key process conditions listed in Table 1.

TABLE 2

| Process conditions | Example 1 (Prior Art) | Example 2 (Prior Art) | Example 3 |
|---|---|---|---|
| Gate insulating layer | Silicon oxynitride (SiON) | | |
| Gate pattern (width) | N-type polysilicon layer (90 nm) | | |
| LDD ion implantation | Arsenic, $2.5 \times 10^{14}$ atoms/cm$^2$, 5 KeV | | |
| Source/drain ion implantation | Arsenic, $5 \times 10^{15}$ atoms/cm$^2$, 40 KeV | | |
| Metal layer | Nickel layer 100 Å | | |
| Silicidation annealing | RTP | Hot plates (conduction scheme) | Convection scheme |

Referring to FIG. 12, the NMOS transistor of Example 3 showed a drain off-current that is lower by about one order and is relatively uniform compared to the NMOS transistors according to Examples 1-2. Although not wishing to be bound by any theory, it is believed that the lower off-current in the NMOS transistor of Example 3 can be attributed to the high quality.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a nickel silicide layer, comprising:
    positioning a wafer between an upper hot plate and a lower hot plate in a heating apparatus containing a heat transferring gas therein, wherein a spacing between the upper hot plate and an upper surface of the wafer is equal to or greater than twice a thickness of the wafer and the lower hot plate and a bottom surface of the wafer are spaced apart a distance equal to or greater than twice the thickness of the wafer by a plurality of quartz supports disposed on the lower hot plate, the wafer including:
        a doped silicon layer on a substrate;
        a nickel layer on the doped silicon layer; and
        a titanium nitride layer on the nickel layer;
    performing a first convective heating step at a first temperature in a range from 200° C. to 400° C., to thereby heat the wafer and convert a first portion of the nickel layer into a nickel silicide layer while a second portion of the nickel layer remains;
    unloading the wafer from the heating apparatus; then
    removing the titanium nitride layer and the second portion of the nickel layer, outside the heating apparatus; then
    repositioning the wafer between the upper hot plate and the lower hot plate in the heating apparatus; and
    performing a second heating step at a second temperature in a range from 300° C. to 600° C., to thereby convert the first nickel silicide layer into a second nickel silicide layer having a different nickel-to-silicon ratio therein relative to the first nickel silicide layer,
    wherein the first temperature and the second temperature are the same as temperatures of the upper and lower hot plates, times to reach the first temperature and the second temperature from the upper and lower plates to the wafer are more than one minute, and fluctuations in the first and second temperatures are controlled to be less than 5° C. during the first convective heating step and the second heating step, respectively.

2. The method of claim 1, wherein the heat transferring gas is selected from the group consisting of nitrogen and argon.

3. The method of claim 1, wherein the wafer is spaced apart from the tipper hot plate and the lower hot plate.

4. The method of claim 1, wherein the first convective heating step comprises:
    a first gas heating step for heating the heat transferring gas using the upper hot plate and the lower hot plate; and
    a first wafer heating step for heating the wafer using the heat transferring gas.

5. The method of claim 4, wherein both the first gas heating step and the first wafer heating step are performed at 320° C. for three minutes.

6. The method of claims 1, wherein said removing is performed using a wet etching process.

7. The method of claim 6, wherein the wet etching process is performed using a mixture of sulfuric acid and hydrogen peroxide.

8. The method of claim 1, wherein the second heating step comprises:
    a second gas heating step for heating the heat transferring gas using the upper hot plate and the lower hot plate; and
    a second wafer heating step for heating the wafer using the heat transferring gas.

9. The method of claim 8, wherein both the second gas heating step and the second wafer heating step are preformed at 430° C. for five minutes.

10. The method of claim 1, wherein the first nickel silicide layer is a di-nickel mono-silicide (Ni$_2$Si) layer and the second nickel silicide layer is a nickel mono-silicide (NiSi) layer.

11. The method of claim 1, wherein an ambient temperature of the wafer is controlled to fluctuate less than 5° C. during the first convective heating step and the second heating step.

12. The method of claim 1, wherein a top surface temperature of the wafer reaches the upper hot plate temperature during said first convective heating step.

* * * * *